(12) United States Patent
Kuwano et al.

(10) Patent No.: US 6,253,354 B1
(45) Date of Patent: Jun. 26, 2001

(54) METHOD AND APPARATUS FOR ANALYZING VARIATIONS IN SOURCE VOLTAGE OF SEMICONDUCTOR DEVICE

(75) Inventors: Kazusumi Kuwano; Akio Hirayama, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/260,018

(22) Filed: Mar. 2, 1999

(30) Foreign Application Priority Data

Sep. 25, 1998 (JP) .................................................. 10-271521

(51) Int. Cl.[7] ...................................................... G06F 17/50
(52) U.S. Cl. ............................................................. 716/4
(58) Field of Search ............................... 716/4, 5, 6

(56) References Cited

U.S. PATENT DOCUMENTS 5,404,310 * 4/1995 Mitsuhashi ............................... 716/13
5,553,008 * 9/1996 Huang ..................................... 703/14
6,066,177 * 5/2000 Hatsuda .................................. 703/19

* cited by examiner

Primary Examiner—John F. Niebling
Assistant Examiner—Stacy Whitmore
(74) Attorney, Agent, or Firm—Staas & Halsey LLP

(57) ABSTRACT

In a method and apparatus of the present invention, variations in source voltage of the power source wiring of an LSI are analyzed cell by cell without test patterns.

An operation time calculator (14) statically calculates the operation time of each instance of a given logic circuit according to the outputs of a net list unit (11), a layout data unit (12), and a cell delay library (13). A maximum current calculator (16) calculates the time, value, and location of maximum current consumption of the logic circuit as a whole according to the outputs of operation time calculator (14), net list unit (11), layout data unit (12); and a cell power library (15). A variation analyzer (17) analyzes and verifies a voltage drop in the power source wiring of the logic circuit according to the output of the maximum current calculator (16).

6 Claims, 12 Drawing Sheets

Fig. 3

[EXAMPLE OF NET LIST]

```
buffd1 I18798 ( .I(w2[31]), .Z(N18798) );
buffd1 I18796 ( .I(w2[29]), .Z(N18796) );
buffd1 I18795 ( .I(w2[28]), .Z(N18795) );
buffd1 I18739 ( .I(w1[4]), .Z(N18739) );
nd02d2 I39 ( .A1(N9), .A2(N6), .ZN(N39) );
..
mx02d0 I2416 ( .I0(N30917), .I1(N30949), .S(N2412), .Z(N19910) );
endmodule
```

[EXAMPLE OF LAYOUT DATA]
NETS ;
- N25203 ( I6586 I ) ( I6063 Z ) ;
- N1048 ( I1048 Z ) ( I1049 I ) ;
        :
ENDNETS;

END;

[EXAMPLE OF CELL DELAY LIBRARY]
DELAYS ;
  .A2(1) ,..X(0)  :T0=500 ,KCL=100;
  .A2(0) ,..X(1)  :T0=500 ,KCL=100;
  .XA1(0) ,..X(0) :T0=900 ,KCL=300;
  .XA1(1) ,..X(1) :T0=900 ,KCL=300;
ENDDELAYS ;
ENDCELL;

[EXAMPLE OF CELL POWER LIBRARY]
L1 =    20 : (0,300),(10,400)
L2 =   200 : (0,600),(10,700)
L3 =  2000 : (0,900),(10,1000)

INSTANCES OF THE SAME TYPE ARE CONNECTED TO ONE ANOTHER THROUGH SIMILAR PATHS AND OPERATE SIMULTANEOUSLY.

THE INSTANCES SHARE POWER SOURCE WIRING AND OPERATE SIMULTANEOUSLY TO EASILY CAUSE A SOURCE VOLTAGE DROP

MAXIMUM POWER CONSUMPTION IS CALCULATED AT THE SIMULTANEOUS OPERATION TIMING, TO VERIFY VARIATIONS IN SOURCE VOLTAGE

METHOD AND APPARATUS FOR ANALYZING VARIATIONS IN SOURCE VOLTAGE OF SEMICONDUCTOR DEVICE

BACKGROUND OF THE INVENTION

1. Field of the Invention

The present invention relates to a method and an apparatus for statically analyzing variations in source voltage of a semiconductor device such as an LSI without test patterns when designing power source wiring for the semiconductor device.

When designing a power source for an LSI, it is important to reduce the current density in the wiring of the power source and minimize variations in source voltage that are dependent on maximum current consumption. The reason why the voltage variations must be minimized is because they increase delays, decrease operation frequencies, and cause malfunctions. Designing a proper power source for recent LSIs is difficult because the scale, the integration, the operating speed, and the power consumption of the LSIs are increasing.

2. Description of the Related Art

An LSI is an integration of cells that are each made of transistors. When designing an LSI, power source wiring of the LSI is tested cell by cell, or transistor by transistor by decomposing each cell into transistors.

The cell-by-cell test externally applies test patterns to a target LSI, simulates the operation of the LSI, calculates an average current consumption of the LSI, and determines whether or not the power source wiring of the LSI can secure a current density that is suitable for the average current consumption. The topology and width of power source wiring must be determined to satisfy a specified current density. Calculating a maximum power consumption according to the cell-by-cell test requires a long time for measurements and a large quantity of data, and therefore, this test does not consider, in the power source designing stage, variations in source voltage related to the maximum power consumption.

The transistor-by-transistor test externally applies test patterns to a target LSI, simulates the operation of the LSI, and calculates not only a current density in power source wiring of the LSI but also variations in source voltage thereof. This test, however, cannot completely verify an LSI chip because the LSI chip is too large to carry out the test thereon.

The cell-by-cell test externally applies test patterns to a target LSI, simulates the operation of the LSI, and calculates the power consumption thereof. The operation of the LSI in the test is dependent on the test patterns. If the test patterns are faithful to the actual operation of the LSI, the calculated power consumption will be correct.

It is difficult, however, to prepare test patterns that are faithful to the actual operation of a given LSI. Usually, the test patterns produce a partial operation of a given LSI and lead to an incorrect calculation of a power consumption for the LSI.

If the test patterns are proper for simulating the actual operation of the LSI, the average power consumption of the LSI will easily be obtained by integrating current flowing through the LSI for a total operation time of the LSI. Calculating a maximum current consumption of the LSI, however, requires superposing partial current waveforms along a time axis. This superposing process requires considerable computer resources and time, and therefore, it is impossible to use the cell-by-cell test to deal with recent large LSIs due to the processing time and computer resource requirements.

The transistor-by-transistor test may precisely simulate the power consumption of a given LSI, but in practice, it cannot test the whole of a given LSI chip due to the large circuit size thereof.

SUMMARY OF THE INVENTION

An object of the present invention is to provide a method and an apparatus for verifying power source wiring for an LSI cell by cell without test patterns.

In order to accomplish the object, there is provided, according to an aspect of the present invention, a method for analyzing variations in source voltage of a semiconductor device. The method comprises the steps of storing a net list that stipulates connections among elements of a logic circuit of the device, and storing the locations and connections of instances arranged on a chip that forms the semiconductor device. The instances corresponds to the elements of the logic circuit. The method further comprises the steps of storing delays related to each cell that consists of at least one of the elements of the logic circuit, statically calculating the operation time of each instance according to the net list and cell delay library, storing current consumption parameters calculated beforehand for the operating states of the cells of the logic circuit, calculating the time, value, and location of maximum current consumption of the logic circuit according to the results of calculating the operation time, storing the net list, storing the location and connections of instances, and storing the current consumption parameters. The method further comprises the step for analyzing and verifying a voltage drop in the power source wiring of the logic circuit according to the output of the maximum current calculation.

According to another aspect of the present invention, there is provided an apparatus for analyzing variations in source voltage of a semiconductor device. The apparatus has a net list unit for storing a net list that stipulates connections among elements of a logic circuit of the device, a layout data unit for storing the locations and connections of instances arranged on a chip that forms the semiconductor device, the instances corresponding to the elements of the logic circuit, a cell delay library for storing delays related to each cell that consists of at least one of the elements of the logic circuit, an operation time calculator for statically calculating the operation time of each instance according to the net list and cell delay library, a cell power library for storing current consumption parameters calculated beforehand for the operating states of the cells of the logic circuit, a maximum current calculator for calculating the time, value, and location of maximum current consumption of the logic circuit according to the outputs of the operation time calculator, net list unit, layout data unit, and cell power library, and a variation analyzer for analyzing and verifying a voltage drop in the power source wiring of the logic circuit according to the output of the maximum current calculator.

The logic circuit may be a clock propagation circuit, and the operation time calculator statically calculates an operation time of the clock propagation circuit.

The logic circuit may have cells that simultaneously operate and share the same power source wiring, and the operation time calculator calculates a maximum current consumed by the power source wiring shared by the cells.

BRIEF DESCRIPTION OF THE DRAWINGS

FIG. 3 shows examples of the contents of a net list unit of the apparatus of FIG. 1;

DESCRIPTION OF THE PREFERRED EMBODIMENTS

The embodiments of the present invention will be explained in detail with reference to the drawings.

Figure 1:
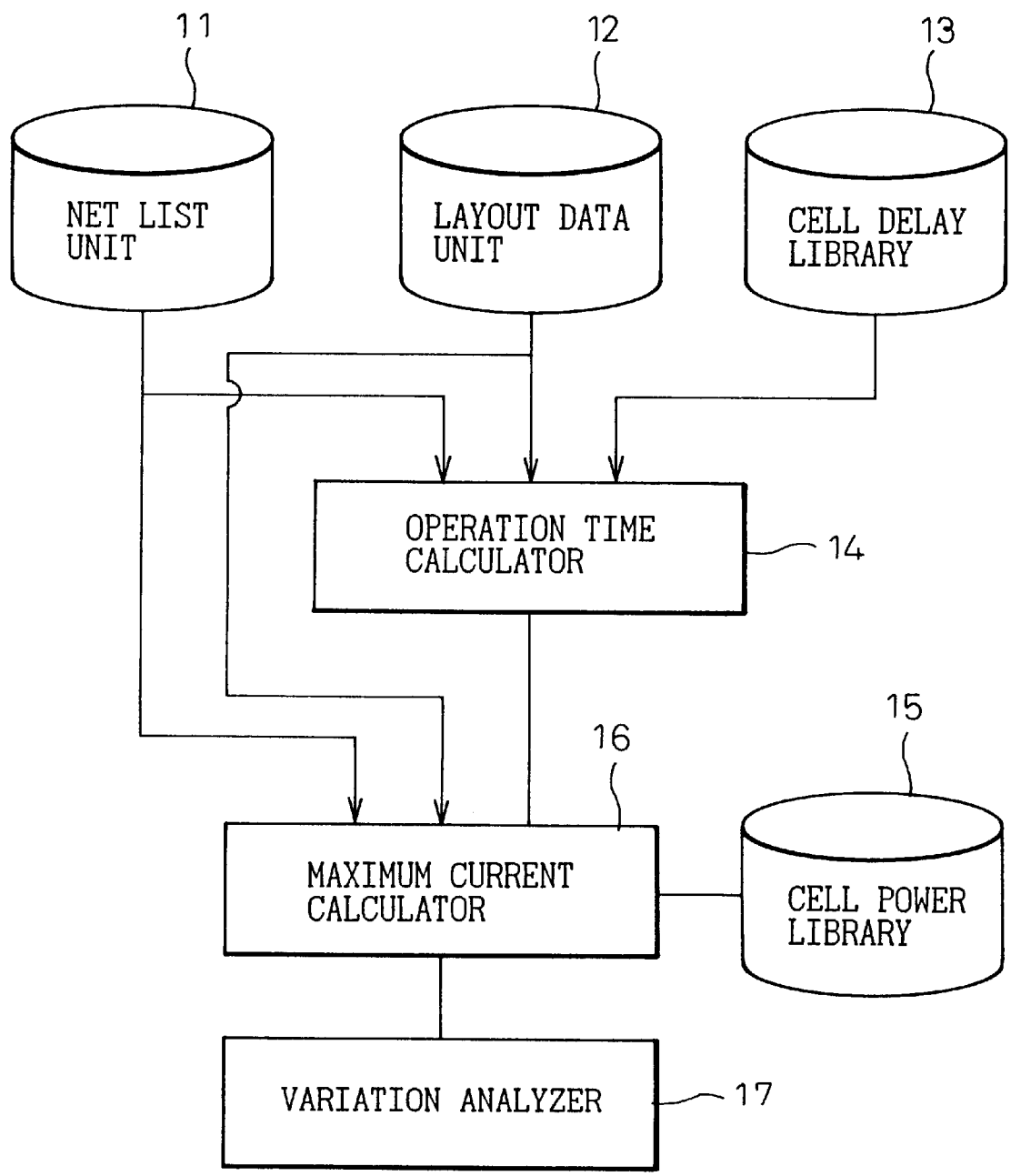
FIG. 1 shows an apparatus for analyzing variations in source voltage of a semiconductor device according to a first embodiment of the present invention.

FIG. 1 shows an apparatus for analyzing variations in source voltage of a semiconductor device according to the first embodiment of the present invention. The apparatus has a net list unit 11, a layout data unit 12, a cell delay library 13, an operation time calculator 14, a cell power library 15, a maximum current calculator 16, and a variation analyzer 17.

The net list unit 11 stores a net list that stipulates connections among elements of a logic circuit to be analyzed.

The layout data unit 12 stores data about the locations and wiring of instances arranged on a chip, the instances corresponding to the elements of the logic circuit.

The cell delay library 13 stores a delay between the input and output ends of each element of the logic circuit.

The operation time calculator 14 statically calculates the operation time of each instance according to the contents of the net list unit 11, layout data unit 12, and cell delay library 13.

The cell power library 15 stores maximum current consumption at the input and output terminals of each cell, a time when a maximum current flows in response to a voltage change at the input and output terminals of each cell, and a start time and an end time of a current change at the input and output terminals of each cell. By reading the contents of the cell power library 15, it is possible to know power consumption parameters for each cell.

The maximum current calculator 16 calculates the time, value, and location of maximum current consumption in the logic circuit according to the outputs of the operation time calculator 14, net list unit 11, layout data unit 12, and cell power library 15. More precisely, the maximum current calculator 16 obtains the location and power source wiring of each instance from the layout data unit 12, recognizes power source wiring shared by instances, superposes, along a time axis, the maximum current consumption of each instance in the shared power source wiring to calculate a maximum current consumption in the shared wiring, and calculates a maximum current consumption among a plurality of power source wiring groups.

The variation analyzer 17 uses the output of the maximum current calculator 16 to analyze and verify variations in source voltage with respect to the maximum current.

Figure 2:
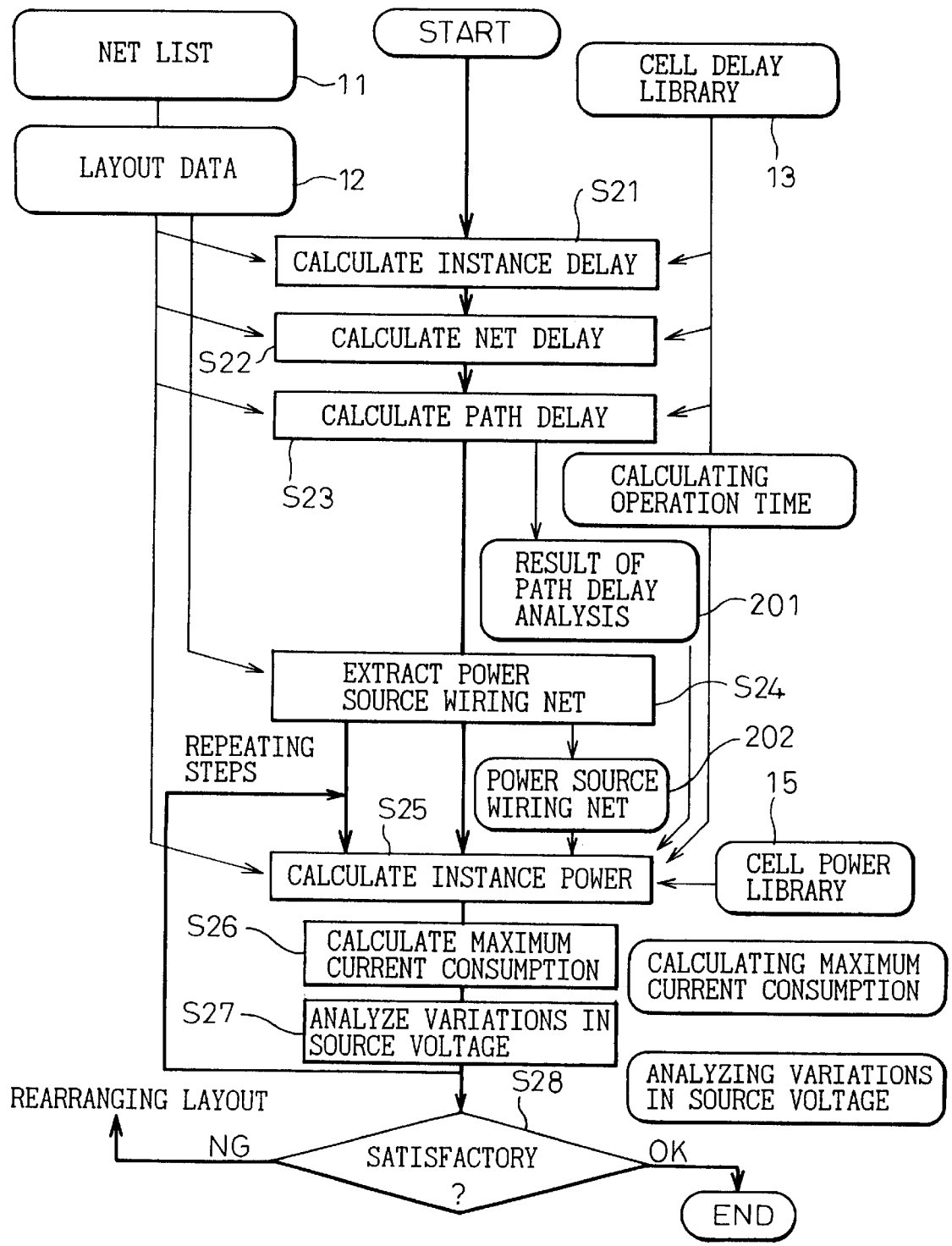
FIG. 2 is a flowchart showing an operation of the apparatus of FIG. 1.

FIG. 2 is a flowchart showing the operation of the apparatus of FIG. 1. The operation time calculator 14 calculates an operation time in steps S21 to S23. Step S21 statically calculates the operation time (instance delay) of each instance of a logic circuit to be analyzed, according to data from the net list unit 11, layout data unit 12, and cell delay library 13. Step S22 calculates a net delay that occurs in a net between the instances, according to the data from the net list unit 11, layout data unit 12, cell delay library 13, and step S21. Step S23 calculates a delay in every path between a start instance and an end instance according to the data from the net list unit 11, layout data unit 12, cell delay library 13, and step S22. Calculation results of step S23 are stored in a file 201.

Step S24 extracts power source wiring nets (FIG. 7), shared by the instances of the logic circuit, according to data from the layout data unit 12. The extracted power source wiring nets are stored in a file 202.

The maximum current calculator 16 calculates a maximum current consumption in steps S25 and S26. Namely, step S25 calculates current consumption at the input and output ends of each instance along a time axis according to the contents of the net list unit 11, files 201 and 202, and cell power library 15. Step S26 superposes the calculated current consumption values to provide a maximum current consumption in each path. From the superposed current consumption of the paths, the time, value, and location of maximum current consumption by the instances is found.

Step S27 analyzes and verifies variations in source voltage in the power source wiring due to the maximum current consumption according to the result provided by step S26.

Steps S25 to S28 are repeated on larger parts of the logic circuit along the power source wiring topology of an LSI to complete the analysis of variations in source voltage of the LSI without employing test patterns.

If an analysis result provided by step S28 is satisfactory, the analysis is terminated, and if not, the layout of the LSI is rearranged.

FIG. 3 shows examples of the contents of the net list unit 11 of FIG. 1. The first row has a cell name of "buffd1" of a given logic circuit, an instance name of "I18798" of the cell, an input terminal name of "I(w2[31])" of the instance, an output terminal name of "Z" of the instance, and a net name of "N18798" connected to the output terminal. Rows that follow have the same structure as the first row. In this way, the net list unit 11 holds, for every cell of a given logic circuit, instance names, input terminal names, output terminal names, and the names of nets connected to the output terminals. The operation time calculator 14 and maximum current calculator 16 read, from the net list unit 11, instance names, input terminal names, output terminal names, and the names of nets connected to the output terminals by specifying the name of a required cell. According to a distance between the input and output terminals of a given instance, a delay (1) in the instance is calculable without applying test patterns thereto.

Figures 4, 5, 6:
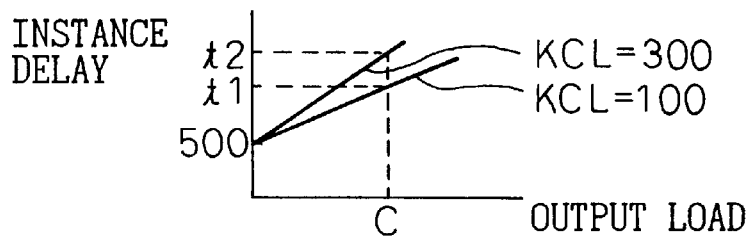
FIG. 4 shows examples of the contents of a layout data unit of the apparatus of FIG. 1.
FIG. 5 shows examples of the contents of a cell delay library of the apparatus of FIG. 1.
FIG. 6 shows examples of the contents of a cell power library of the apparatus of FIG. 1.

FIG. 4 shows examples of the contents of the layout data unit 12 of FIG. 1. The first row contains an instance name of "I6586" serving as a connection origin, an input terminal name of "I" of the instance, an instance name of "I6063" serving as a connection destination, an output terminal name of "Z" of the instance, and a net name of "N25203" between the connection origin and the connection destination. In practice, there are the coordinates of net nodes between the connection origin (I6586 I) and the connection destination (I6063 Z). By reading the coordinates of net nodes, it is possible to calculate load capacitance associated with the net. Namely, a net delay (2) is calculable from the load capacitance without applying test patterns thereto.

FIG. 5 shows examples of the contents of the cell delay library 13 of FIG. 1. Generally, a delay in a cell changes in response to the size of load connected to the cell. The contents of the cell delay library 13 stipulate relationships between the size of load and a delay in a cell. For example, T0=500, T0=900, and the like express instance delays when the output load is zero, and KCL=100, KCL=300, and the like express the degrees of change in the instance delays with respect to a change in the output load. For example, in a graph at the bottom of FIG. 5, an instance having KCL=100 shows an instance delay of t1 with respect to an output load of C, while an instance having KCL=300 shows an instance delay of t2 with respect to the same output load of C.

FIG. 6 shows examples of the contents of the cell power library 15 of FIG. 1. When an input signal is applied to a cell, the cell provides an output waveform. A rise of the output waveform changes in response to the output load of the cell. The cell power library 13 holds the power consumption parameters calculated beforehand for each cell. The power consumption parameters of a given cell include a maximum current consumption of each state at each terminal of the cell, a time when a maximum current is produced in response to a voltage change at each terminal of the cell, and the start and end time points of a current change at each terminal of the cell. Namely, the contents of the cell power library 13 stipulate relationships between the size of output load and the rise time of an output waveform of the cell. In FIG. 6, there are rise times of 20, 200, and 2000. When the rise time is 20, a maximum current value is 300 with respect to an output load of 0. The maximum current increases to 400 when the output load is 10. When the rise time is 200, the maximum current is 600 with respect to an output load of 0. When the output load increases to 10, the maximum current increases to 700.

Figure 7:
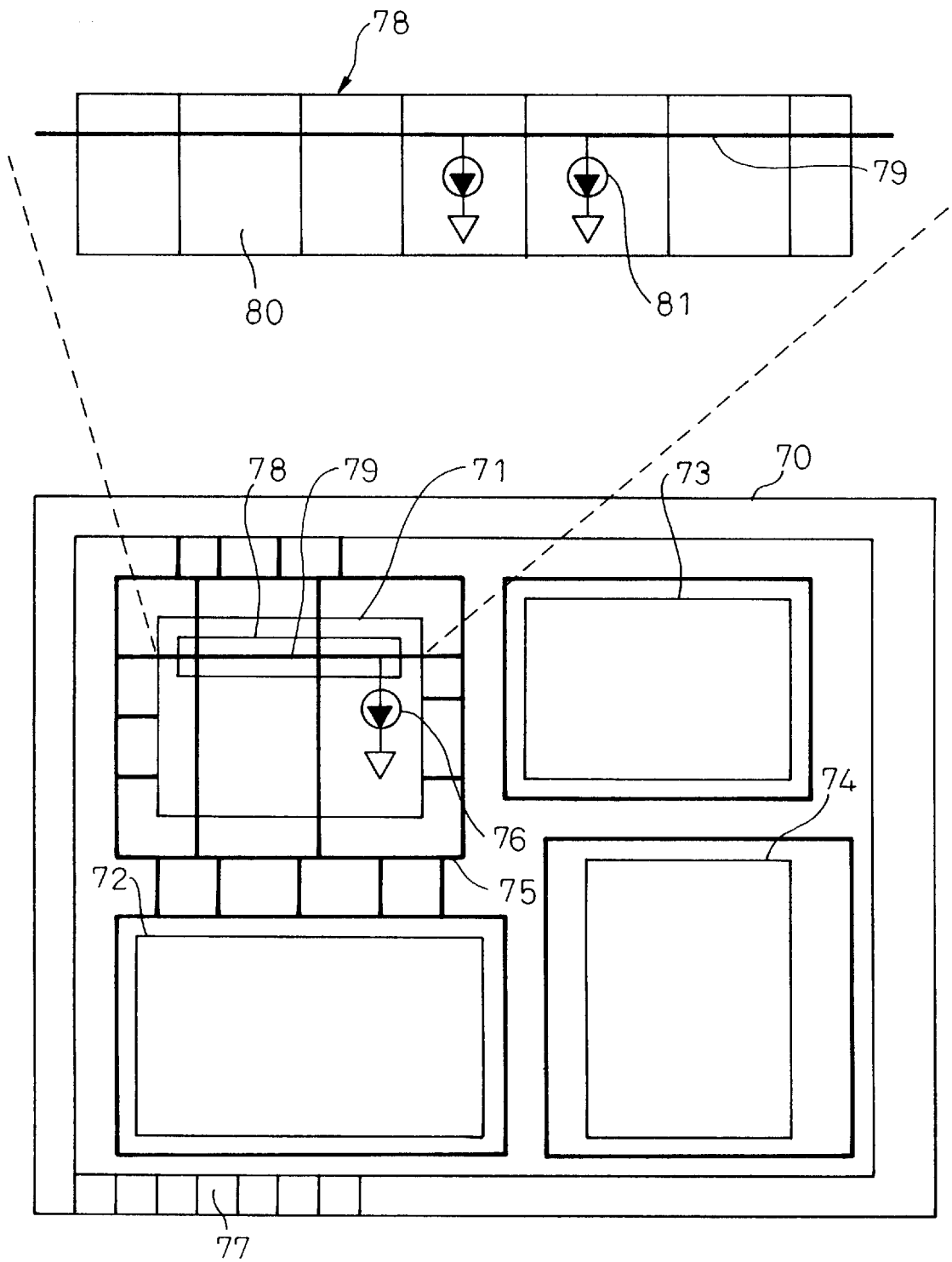
FIG. 7 shows a layout on the surface of an LSI chip.

FIG. 7 shows a layout on the surface of an LSI chip. The LSI chip 70 includes four layout blocks 71 to 74. A thick line 75 is a power source line. The layout block 71 contains a current source 76, a circuit block 78, and a power source line 79 passing through the circuit block 78. Each of the layout blocks 72 to 74 has a structure similar to the layout block 71.

The upper part of FIG. 7 is an enlarged view of the circuit block 78 in the layout block 71. The circuit block 78 includes instances 80 each of which is connected to the power source line 79 through an equivalent current source 81.

Steps S25 to S27 of FIG. 2 are carried out on the upper part of FIG. 7, and the same steps are repeated on the other parts of the LSI chip 70 to analyze variations in source voltage of the LSI 70 and design optimum power source wiring for the LSI 70.

Figure 8:
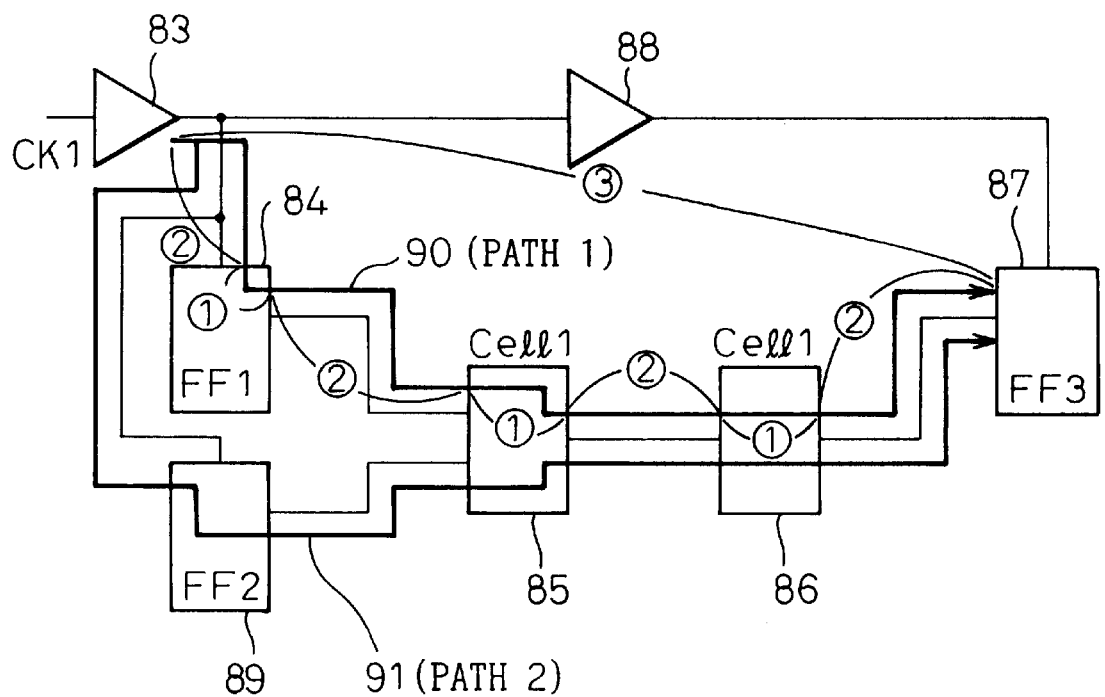
FIG. 8 shows the details of a circuit block shown in the upper part of FIG. 7.

FIG. 8 shows the details of the upper part of FIG. 7. A first power source line 90 (path 1) and a second power source line 91 (path 2) run between the output of a clock buffer 83 and a flip-flop 87 (FF3). The first power source line 90 connects a first flip-flop 84 (FF1), a first combinational circuit 85 (Cell1), a second combinational circuit 86 (Cell2), and a third flip-flop 87 (FF3) in series. The second power source line 91 connects a second flip-flop 89 (FF2), the first combinational circuit 85, the second combinational circuit 86, and the third flip-flop 87 in series.

A signal delay (1) of each of the flip-flops and combinational circuits in the power source line 90 is obtained by reading the net list unit 11.

In the power source line 90, a delay (2) between the output of the clock buffer 83 and the input of the flip-flop 84, a signal delay (2) between the output of the flip-flop 84 and the input of the combinational circuit 85, a signal delay (2) between the output of the circuit 85 and the input of the combinational circuit 86, and a signal delay (2) between the output of the circuit 86 and the input of the flip-flop 87 are obtained from the contents of the layout data unit 12.

A delay (3) between the output of the clock buffer 83 and the input of the flip-flop 87 in the power source line 90 is a path delay provided by step S23 of FIG. 2 and is calculated according to the delays (1) and (2) and output load capacitance based on the contents of the cell delay library 13.

Figure 9:
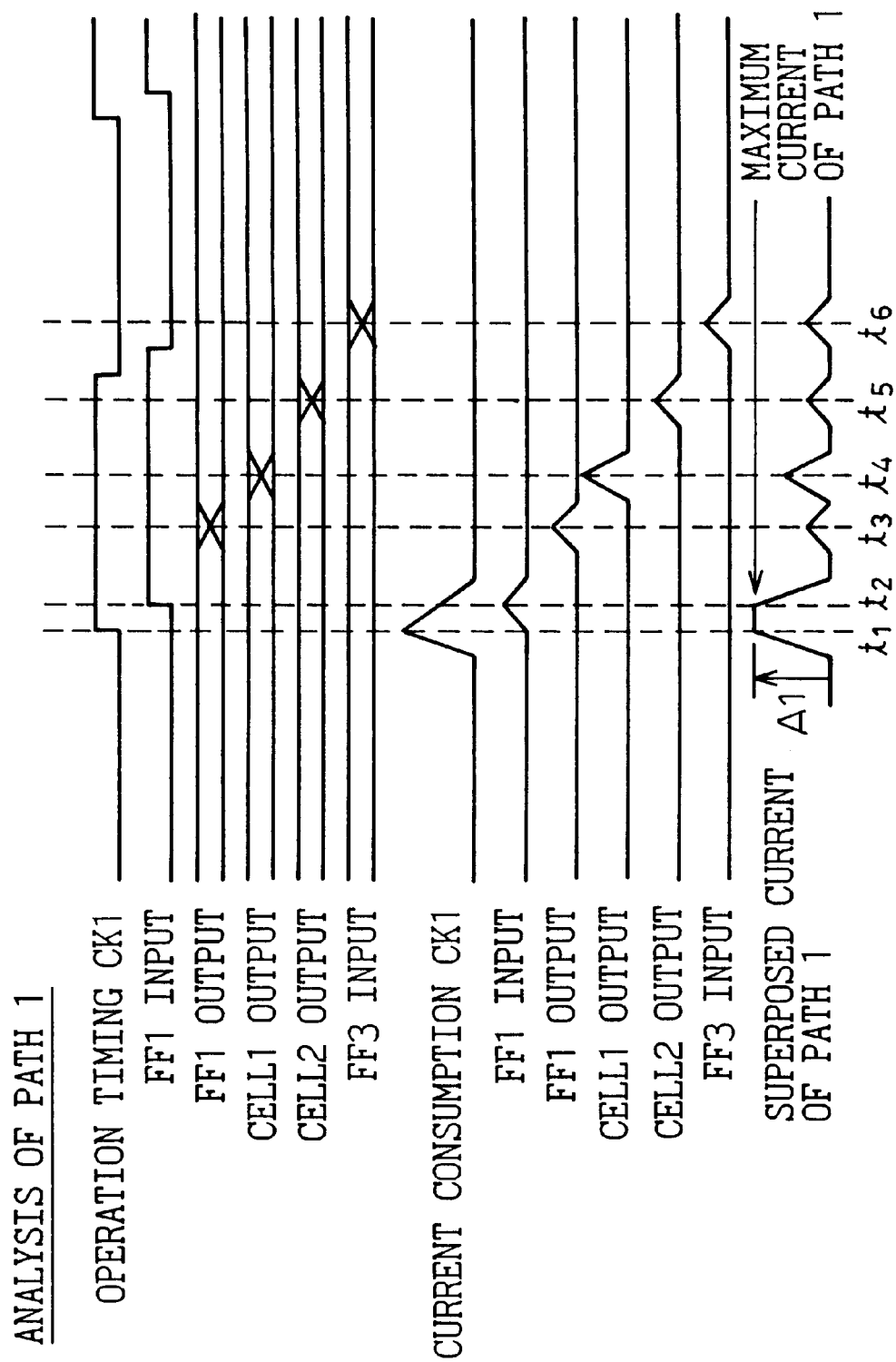
FIG. 9 is a graph showing the operations and current consumption of flip-flops and combinational circuits in the circuit block of FIG. 8.

FIG. 9 is a graph showing the operations and current consumption of the flip-flops and combinational circuits in the power source line 90 of FIG. 8 when a clock signal CK1 is applied to the clock buffer 83. This graph is obtained in the middle of calculating the delay (3). The clock signal CK1 rises at t1 and is applied to the clock buffer 83. At t2, the input of the flip-flop 84 rises, and at t3, the output thereof changes. At t4, the output of the combinational circuit 85 changes, and at t5, the output of the combinational circuit 86 changes. At t6, the input of the flip-flop 87 changes. These changes are calculable. Namely, these time points are obtained from the delays (1) and (2). The current consumption of each instance is calculable according to the output load of the instance, which is obtained from the net list unit 11 and layout data unit 12, and the contents of the cell power library 15.

The current consumption values calculated along the line 90, i.e., the path 1 are superposed to provide the graph shown at the bottom of FIG. 9. The graph shows that a maximum current value in the path 1 occurs between the time points t1 and t2 and is A1 in size.

Figure 10:
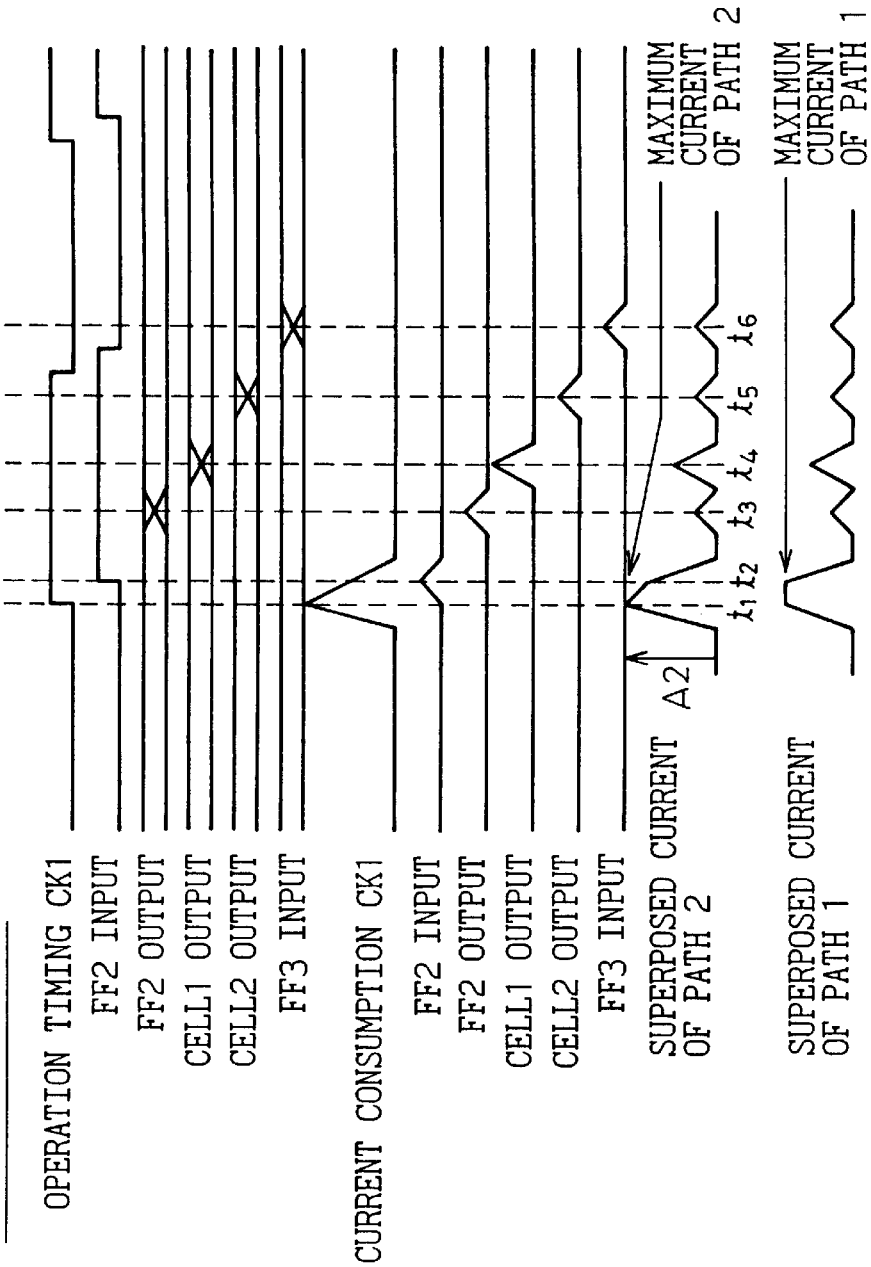
FIG. 10 is a graph showing the operations and current consumption of elements arranged along a path 2 in the circuit block of FIG. 8.

FIG. 10 is a graph showing the operations and current consumption of the flip-flops and combinational circuits in the path 2 (the power source line 91) of FIG. 8. This graph is obtained through the same procedures as those for FIG. 9. The graph shows that a maximum current value in the path 2 occurs between time points t1 and t2 and is A2 in size.

Comparing FIGS. 9 and 10 with each other, it can be seen that the maximum current value A2 in the second line 91 is greater than the maximum current value A1 in the first line 90. Accordingly, the maximum current value A2 in the second line 91 is adopted as a maximum current value of the circuit block 78 of FIG. 7.

Figure 11:
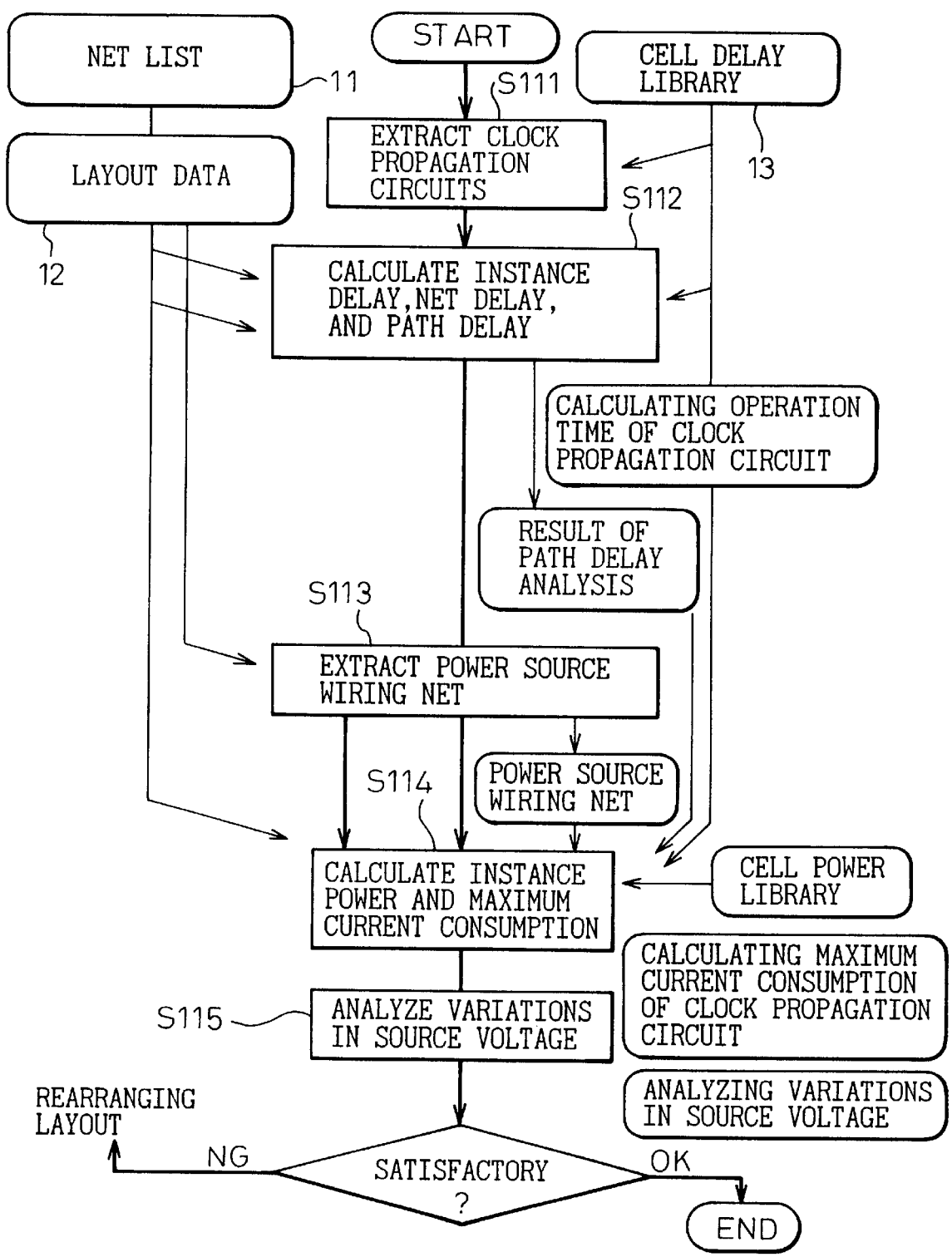
FIG. 11 is a flowchart showing a method of analyzing variations in source voltage according to a second embodiment of the present invention.

FIG. 11 is a flowchart showing a method of analyzing variations in source voltage according to the second embodiment of the present invention. The second embodiment analyzes a clock propagation circuit unlike the first embodiment of FIG. 2 that analyzes an optional logic circuit such as one shown in FIG. 8.

In a synchronous logic circuit, a part that mostly consumes power is a clock propagation circuit. To meet a requirement for a high-speed operation, the clock propagation circuits employ a technique of adjusting operation timing to ease timing design. When studying clock propagation circuits in a given semiconductor device, it is understood that most power is consumed at the same timing. Namely, the value and time of a maximum current consumption necessary for analyzing variations in source voltage are calculable from delay information about the clock propagation circuits. To reduce power consumption, some LSIs are designed to stop clock propagation circuits in synchronization with LSI operation. Even in such LSIs, it is easy to determine whether or not the clock propagation circuits are operating, without relying on test patterns. Accordingly, it is possible even for such LSIs to statically calculate the value and time of a maximum current consumption. Based on these considerations, the second embodiment of the present invention measures the clock propagation circuits of a given semiconductor device to analyze and verify variations in source voltage of the power source wiring of the device.

In FIG. 11, step S111 extracts clock propagation circuits according to the contents of the net list 11, layout data unit 12, and cell delay library 13. With respect to the extracted clock propagation circuits, steps S112 to S115 carry out the same calculations as those of steps S23 to S27 of FIG. 2, to analyze variations in source voltage.

Figure 12:
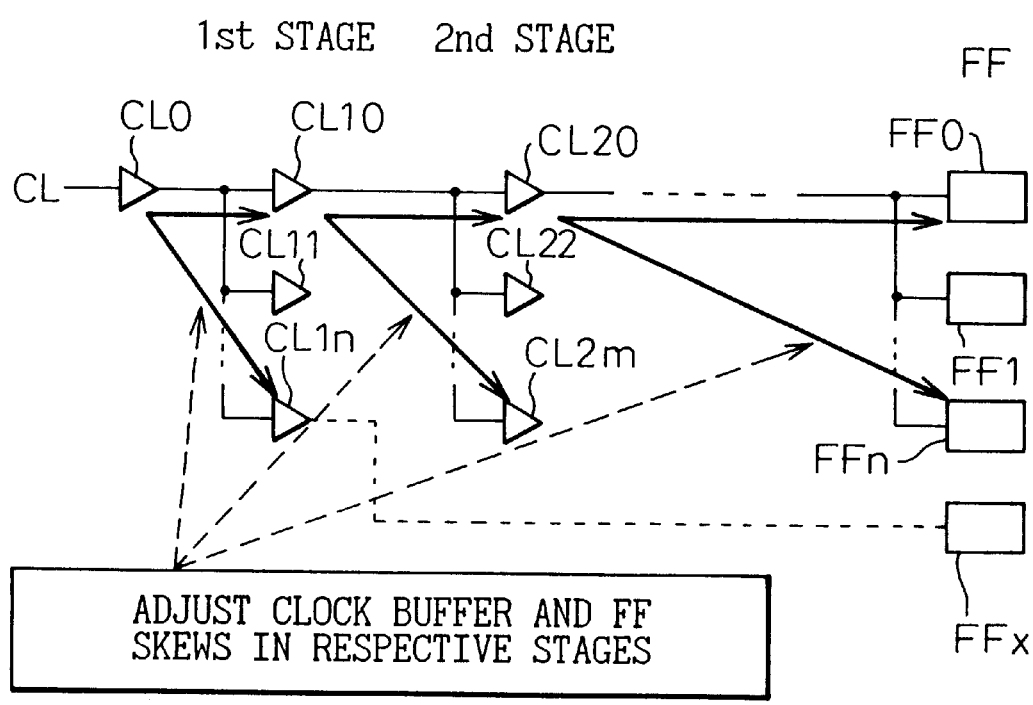
FIG. 12 shows a clock propagation circuit.

FIG. 12 shows an example of the clock propagation circuits. The output of a clock buffer CL0 is supplied to clock buffers CL10 to CL1n arranged in a first stage. The output of the clock buffer CL10 is supplied to clock buffers CL20 to CL2m arranged in a second stage. In this way, clock buffers are successively connected to end flip-flops FF0 to FFn and FFx. These flip-flops are driven by the clock buffers in the preceding stage. This circuit is designed to minimize skews in clock signals in the clock buffers of each stage and the end flip-flops. This means that the clock buffers or flip-flops in the same stage operate substantially at the same timing, and therefore, it is easy to calculate the value and time of a maximum current consumption.

Figure 13:
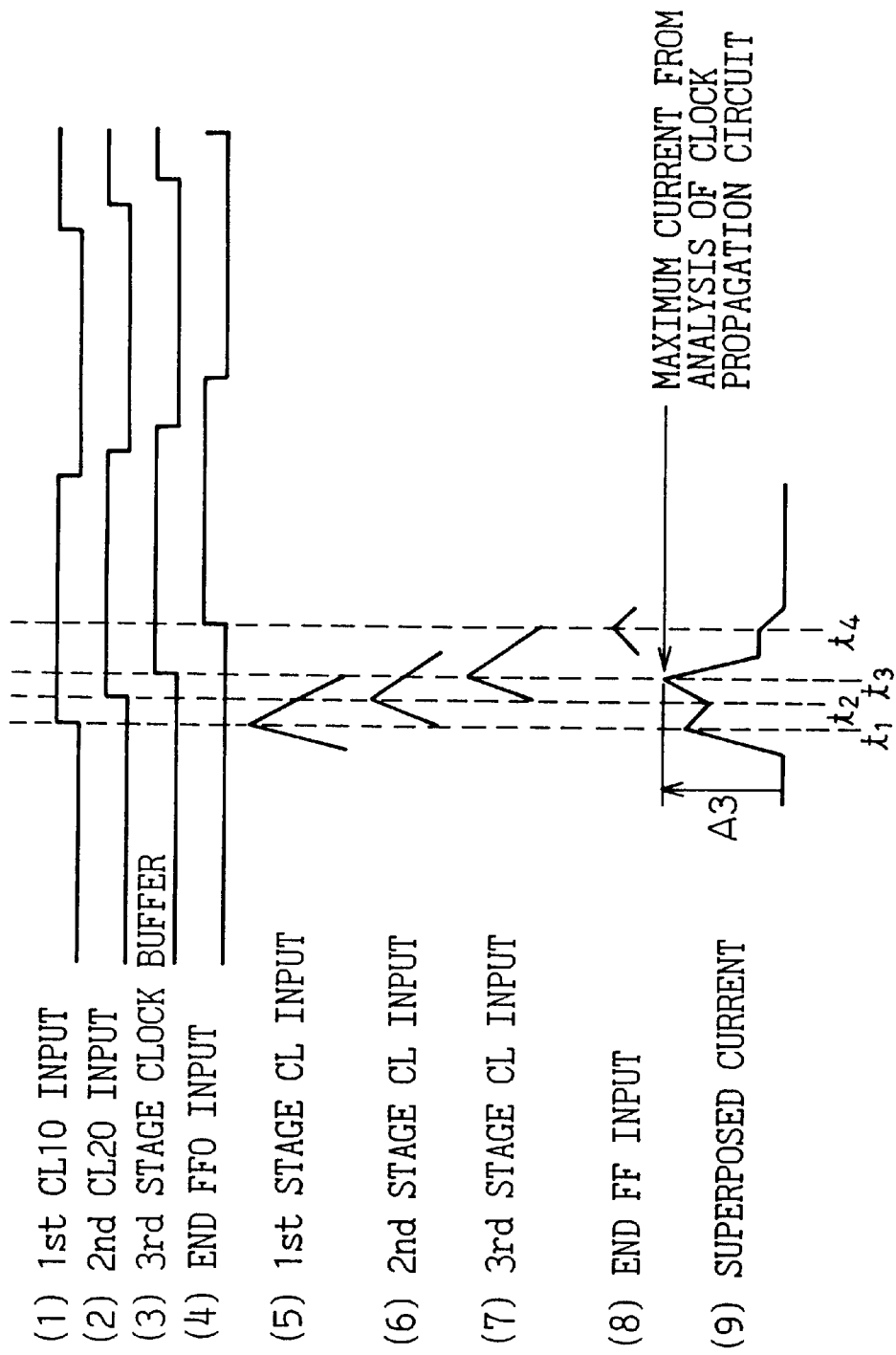
FIG. 13 shows input waveforms in various stages in the circuit of FIG. 12 with respect to a clock signal CL.

FIG. 13 shows input waveforms in various stages in the circuit of FIG. 12 with respect to a clock signal CL. An input current to the clock buffer CL10 in the first stage changes as indicated with (1). This is calculated by carrying out the steps of FIG. 11. The same steps can calculate changes (2), (3), and (4) of FIG. 13 in input currents to the clock buffer CL20 in the second stage, a clock buffer (not shown) in the third stage, and the end flip-flop FF0.

It is understood that input currents to the clock buffers CL11 to CL1n in the first stage change like waveform (1) of FIG. 13 and that input currents to the clock buffers CL21 to CL2m in the second stage change like waveform (2) of FIG. 13. Input currents in the other stages change in the same manner. However, the timing and size of a change in current at the input of each clock buffer or flip-flop are determined by the length of a wire connected to the element and a gate delay of the element, as mentioned in the first embodiment. Namely, the maximum values and timing of changes of input currents to the elements differ from stage to stage.

A waveform (5) of FIG. 13 shows a change in a cumulative input current of all clock buffers in the first stage, a waveform (6) a change in a cumulative input current of all clock buffers in the second stage, a waveform (7) a change in a cumulative input current of all clock buffers in the third stage, and a waveform (8) a change in a cumulative input current of all end flip-flops. A waveform (9) shows a superposition of the waveforms (5) to (8) and has a maximum current value A3 at t3. The second embodiment of the present invention analyzes every clock propagation circuit in a given semiconductor chip in this way and regards a maximum current found among them as a representative of the maximum power of the semiconductor chip. Consequently, the second embodiment is capable of analyzing variations in the source voltage of a given semiconductor chip without applying test patterns thereto.

In a target synchronous logic circuit, the present invention examines clock propagation circuits, calculates a maximum current consumption value from a static operation time, and analyzes and verifies variations in source voltage of the circuit. Examining only clock propagation circuits greatly reduces instances and power source wiring nets on which calculations must be made, and therefore, the present invention is advantageous in terms of processing scale and processing time.

Figure 14:
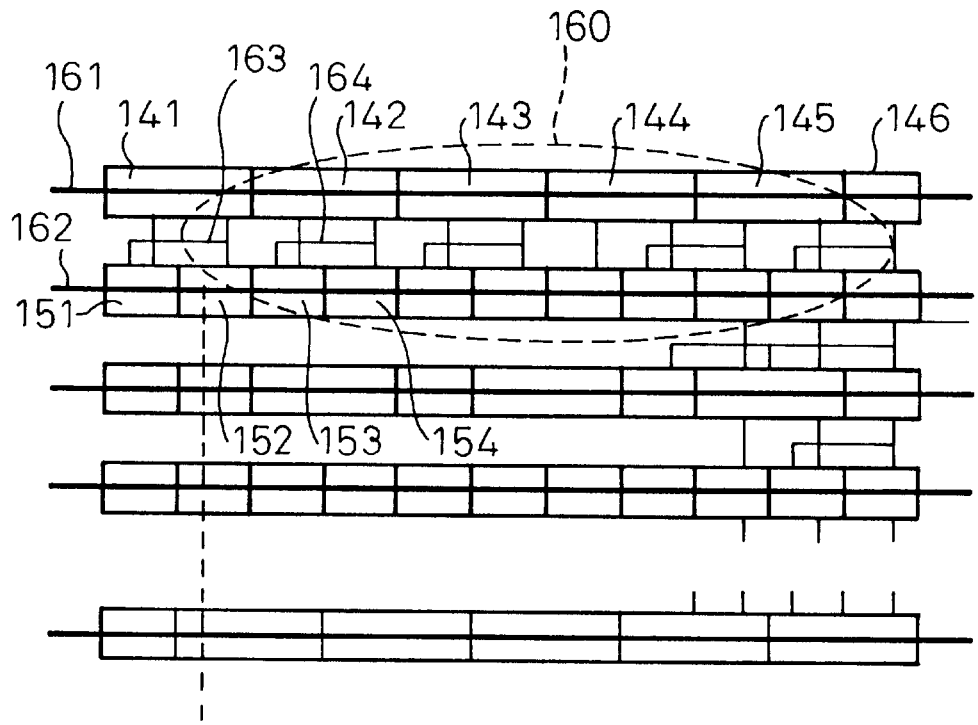
FIG. 14 shows wiring patterns in a logic circuit whose source voltage is analyzed according to a third embodiment of the present invention.

FIG. 14 shows wiring patterns in a logic circuit whose source voltage is analyzed according to a third embodiment of the present invention.

In addition to the clock propagation circuits, instances of combinational circuits that share the same power source and operate simultaneously also vary source voltage. These instances or circuits are usually employed to regularly carry out the same operation on a plurality of bits and are designed to operate synchronously. Therefore, it is possible to statically calculate the timing of operation thereof according to the present invention. For example, the first embodiment may statically calculate the operation time and maximum current consumption of each instance, superpose the maximum current consumption values, and analyze and verify variations in source voltage.

In FIG. 14, instances 141 to 146 are in a first circuit pattern, and instances 151, 152, and the like are in a second circuit pattern. A power source line 161 passes through the first circuit pattern, and a power source line 162 passes through the second circuit pattern. A part 160 encircled with a dotted line contains the first and second circuit patterns, and variations in source voltage in the part 160 are going to be analyzed. The instance 141 of the first circuit pattern is connected to the instances 151 and 152 of the second circuit pattern through a signal line 163. The instance 142 of the first circuit pattern is connected to the instances 153 and 154 of the second circuit pattern through a signal line 164. The other instances of the first circuit pattern are similarly connected to the instances of the second circuit pattern through signal lines. Examples of this type of circuit in which the same type of instances are connected to one another through similar paths are the clock propagation circuits mentioned above, data buses, adders, multipliers, and ALUs.

In these circuits, instances that are connected to the same power source wiring operate substantially simultaneously. Namely, the instances 141 to 146 connected to the power source line 161 simultaneously operate, and therefore, it is possible to calculate the value and time of maximum current flowing through the power source line 161 when an input signal is applied to the instances 141 to 146 in parallel. Similarly, the value and time of maximum current flowing through the power source line 162 are calculable. These maximum current values are superposed, like the example of FIG. 9, to find the value and time of maximum current of the part 160.

The value and time of maximum current of every part of a given logic circuit are calculable in this way, and the value and time of maximum current of the logic circuit as a whole can be found. Then, variations in source voltage of the logic circuit are analyzed and verified.

Consequently, the first and second embodiments of the present invention are applicable to analyze and verify variations in source voltage of not only the clock propagation circuits but also other circuits that widely fluctuate the source voltage and involve instances that substantially simultaneously operate on the same power source wiring.

As explained above in detail, the present invention is capable of statically calculating the maximum current consumption of a given logic circuit and analyzing and verifying variations in source voltage of the logic circuit without simulating the operation thereof by test patterns.

What is claimed is:

1. A method for analyzing variations in source voltage of a semiconductor device, comprising the steps of:

storing a net list that stipulates connections among elements of a logic circuit of the device;

storing the locations and connections of instances arranged on a chip that forms the semiconductor device, the instances corresponding to the elements of the logic circuit;

storing delays related to each cell that consists of at least one of the elements of the logic circuit;

statically calculating the operation time of each instance according to the outputs of the net list means and cell delay library;

storing current consumption parameters calculated beforehand for the operating states of the cells of the logic circuit;

calculating the time, value, and location of maximum current consumption of the logic circuit according to the results of calculating the operation time, storing the net list, storing the location and connections of instances, and storing the current consumption parameters; and analyzing and verifying a voltage drop in the power source wiring of the logic circuit according to the result of the maximum current calculation.

2. The method as claimed in claim 1, wherein:

the logic circuit is a clock propagation circuit; and in the step of calculating the operation time, an operation time of the clock propagation circuit is statically calculated.

3. The method as claimed in claim 1, wherein:

the logic circuit has cells that simultaneously operate and share the same power source wiring; and in the step of statistically calculating the operation time, a maximum current value consumed by the power source wiring shared by the cells is calculated.

4. An apparatus for analyzing variations in source voltage of a semiconductor device, comprising:

a net list unit for storing a net list that stipulates connections among elements of a logic circuit of the device;

layout data unit for storing the locations and connections of instances arranged on a chip that forms the semiconductor device, the instances corresponding to the elements of the logic circuit;

a cell delay library for storing delays related to each cell that consists of at least one of the elements of the logic circuit;

operation time calculator for statically calculating the operation time of each instance according to the outputs of the net list unit and cell delay library;

a cell power library for storing current consumption parameters calculated beforehand for the operating states of the cells of the logic circuit;

maximum current calculator for calculating the time, value, and location of maximum current consumption of the logic circuit according to the outputs of the operation time calculator, net list unit, layout data unit, and cell power library; and variation analyzer for analyzing and verifying a voltage drop in the power source wiring of the logic circuit according to the output of the maximum current calculator.

5. The apparatus as claimed in claim 4, wherein:

the logic circuit is a clock propagation circuit; and the operation time calculator statically calculates an operation time of the clock propagation circuit.

6. The apparatus as claimed in claim 4, wherein:

the logic circuit has cells that simultaneously operate and share the same power source wiring; and the operation time calculator calculates a maximum current value consumed by the power source wiring shared by the cells.

* * * * *